US012748159B2

(12) United States Patent
Matsuoka

(10) Patent No.: US 12,748,159 B2
(45) Date of Patent: Sep. 29, 2026

(54) BATTERY PROCESSING SYSTEM AND BATTERY PROCESSING METHOD

(71) Applicant: TOYOTA JIDOSHA KABUSHIKI KAISHA, Toyota (JP)

(72) Inventor: Shohei Matsuoka, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 393 days.

(21) Appl. No.: 18/487,209

(22) Filed: Oct. 16, 2023

(65) Prior Publication Data

US 2024/0175934 A1 May 30, 2024

(30) Foreign Application Priority Data

Nov. 25, 2022 (JP) ................................ 2022-188199

(51) Int. Cl.

*G01R 31/392* (2019.01)
*G01R 31/378* (2019.01)
*H01M 10/0525* (2010.01)
*H01M 10/44* (2006.01)

(52) U.S. Cl.

CPC ......... *G01R 31/392* (2019.01); *G01R 31/378* (2019.01); *H01M 10/448* (2013.01); *H01M 10/0525* (2013.01)

(58) Field of Classification Search

None

See application file for complete search history.

(56) References Cited

U.S. PATENT DOCUMENTS

| | | | | |
|---|---|---|---|---|
| 2005/0238976 A1* | 10/2005 | Taniguchi | .......... | G03G 5/08235 430/65 |
| 2013/0328566 A1* | 12/2013 | Hojo | .................. | H01M 10/446 324/426 |
| 2021/0203013 A1* | 7/2021 | Tsujiko | ............ | H01M 10/0525 |
| 2021/0231745 A1* | 7/2021 | Nagai | .................. | G01R 31/392 |
| 2021/0234206 A1* | 7/2021 | Kanada | .............. | G01R 31/3828 |

FOREIGN PATENT DOCUMENTS

| | | |
|---|---|---|
| CN | 113036834 A | 6/2021 |
| JP | 2017-45621 A | 3/2017 |
| JP | 2021-103646 A | 7/2021 |
| JP | 2021-118148 A | 8/2021 |

* cited by examiner

*Primary Examiner* — Raymond L Nimox
(74) *Attorney, Agent, or Firm* — Oliff PLC

(57) ABSTRACT

A control device executes processing including: executing first elimination processing when there is a history of addition of degradation indicator values ΣD and also when degradation indicator value ΣD is larger than a first threshold value TH1; measuring a characteristic value of a cell; executing second elimination processing; determining reusability when the characteristic value is within an allowable range; determining unreusability when the characteristic value is out of the allowable range; and executing the second elimination processing when degradation indicator value ΣD is first threshold value TH1 or less.

6 Claims, 5 Drawing Sheets

BATTERY PROCESSING SYSTEM AND BATTERY PROCESSING METHOD

CROSS REFERENCE TO RELATED APPLICATIONS

This nonprovisional application is based on Japanese Patent Application No. 2022-188199 filed on Nov. 25, 2022 with the Japan Patent Office, the entire contents of which are hereby incorporated by reference.

BACKGROUND

Field

The present disclosure relates to a battery processing system.

Description of the Background Art

In some electrically powered vehicles, for example, a lithium-ion battery is mounted as a power storage device for traveling. It is known that the lithium-ion battery can degrade as charge and discharge are performed with a large amount of current (at a high rate). Such degradation is also referred to as "high-rate degradation". Various technologies are proposed to restrain the high-rate degradation of lithium-ion batteries.

For example, Japanese Patent Laying-Open No. 2021-103646 discloses a technology in which a degradation indicator value ΣD, which indicates an extent of progress of high-rate degradation, is calculated, and degradation mitigation processing is executed when the calculated degradation indicator value ΣD exceeds a threshold value.

SUMMARY

As degradation occurring when a lithium-ion battery is charged and discharged at a high rate, degradation due to a nonuniformity of potentials (unevenness of potentials) in an electrode plane can occur besides the above-described high-rate degradation due to a nonuniformity of salt concentrations (lithium-ion concentrations) (unevenness of salt concentrations) in the electrode plane. Accordingly, even if high-rate degradation can be mitigated by performing degradation mitigation processing on a lithium-ion battery as described above, degradation due to the unevenness of potentials may remain in some cases. As a result, when the lithium-ion battery is thereafter relocated as a reused battery in another vehicle, or in any other like case, a recognized degree of degradation may be larger than an actual degree, or a recognized battery life may be erroneously shorter without a restorable capacity being realized, in some cases.

An object of the present disclosure is to provide a battery processing system and a battery processing method that eliminate degradation due to the unevenness of potentials.

A battery processing system according to an aspect of the present disclosure includes: a lithium-ion battery including an electrode assembly; and a control device that controls charge and discharge of the lithium-ion battery. The control device acquires an indicator value indicating an extent of progress of degradation of the lithium-ion battery due to a nonuniformity of a concentration distribution of lithium ions within the electrode assembly. When the indicator value is more than a first threshold value, the control device executes first elimination processing of eliminating the degradation due to the nonuniformity of the concentration distribution.

When the indicator value is the first threshold value or less and also when there is a period during which the indicator value is more than a second threshold value that is smaller than the first threshold value, the control device executes second elimination processing of eliminating degradation due to a nonuniformity of potentials in an electrode plane of the electrode assembly that occurs as a result of discharge of the lithium-ion battery.

Thus, since the second elimination processing is executed when there is a period during which the indicator value is more than the second threshold value, the degradation of the lithium-ion battery due to the nonuniformity of potentials in the electrode plane of the electrode assembly can be eliminated. Moreover, since the first elimination processing is executed when the indicator value is more than the first threshold value, the degradation due to the nonuniformity of the concentration distribution can be eliminated.

In an embodiment, the second elimination processing includes processing of performing over-discharge of the lithium-ion battery to cause the lithium-ion battery to reach a predetermined voltage.

Thus, by performing over-discharge of the lithium-ion battery to cause the lithium-ion battery to reach the predetermined voltage, a change can be caused that eliminates early on the nonuniformity of potentials in the electrode plane of the electrode assembly.

In another embodiment, the control device executes the second elimination processing when the indicator value is the first threshold value or less and also when there is a history in which the indicator value changes from an initial value to become more than the second threshold value.

Such processing is executed since the presence of a history in which the indicator value changes from the initial value to become more than the second threshold value indicates a possibility that the degradation of the lithium-ion battery due to the nonuniformity of potentials in the electrode plane of the electrode assembly occurs. Accordingly, such degradation can be eliminated by executing the second elimination processing.

In still another embodiment, the control device executes the second elimination processing after executing the first elimination processing when the indicator value is more than the first threshold value.

Thus, the degradation of the lithium-ion battery due to the nonuniformity of potentials in the electrode plane of the electrode assembly can be eliminated by executing the second elimination processing. Moreover, the degradation due to the nonuniformity of the concentration distribution can be eliminated by executing the first elimination processing.

In even another embodiment, the electrode assembly includes a positive electrode and a negative electrode. At least one of active material of the positive electrode and active material of the negative electrode contains a material that is capable of intercalating and deintercalating the lithium ions.

Thus, since the active material of the positive electrode or the active material of the negative electrode contains a material that is capable of intercalating and deintercalating the lithium ions, the degradation of the lithium-ion battery due to the nonuniformity of potentials in the electrode plane of the electrode assembly can be eliminated by executing the second elimination processing.

A battery processing method according to another aspect of the present disclosure is a battery processing method for eliminating degradation of a lithium-ion battery including an electrode assembly. The battery processing method includes:

acquiring an indicator value indicating an extent of progress of degradation of the lithium-ion battery due to a nonuniformity of a concentration distribution of lithium ions within the electrode assembly; when the indicator value is more than a first threshold value, executing first elimination processing of eliminating the degradation due to the nonuniformity of the concentration distribution; and when the indicator value is the first threshold value or less and also when there is a period during which the indicator value is more than a second threshold value that is smaller than the first threshold value, executing second elimination processing of eliminating degradation due to a nonuniformity of potentials in an electrode plane of the electrode assembly that occurs as a result of discharge of the lithium-ion battery.

The foregoing and other objects, features, aspects and advantages of the present disclosure will become more apparent from the following detailed description of the present disclosure when taken in conjunction with the accompanying drawings.

DESCRIPTION OF THE PREFERRED EMBODIMENTS

Hereinafter, an embodiment of the present disclosure is described in detail with reference to the drawings. Note that the same or equivalent parts are denoted by the same reference signs throughout the drawings, and a description thereof is not repeated.

Figure 1:
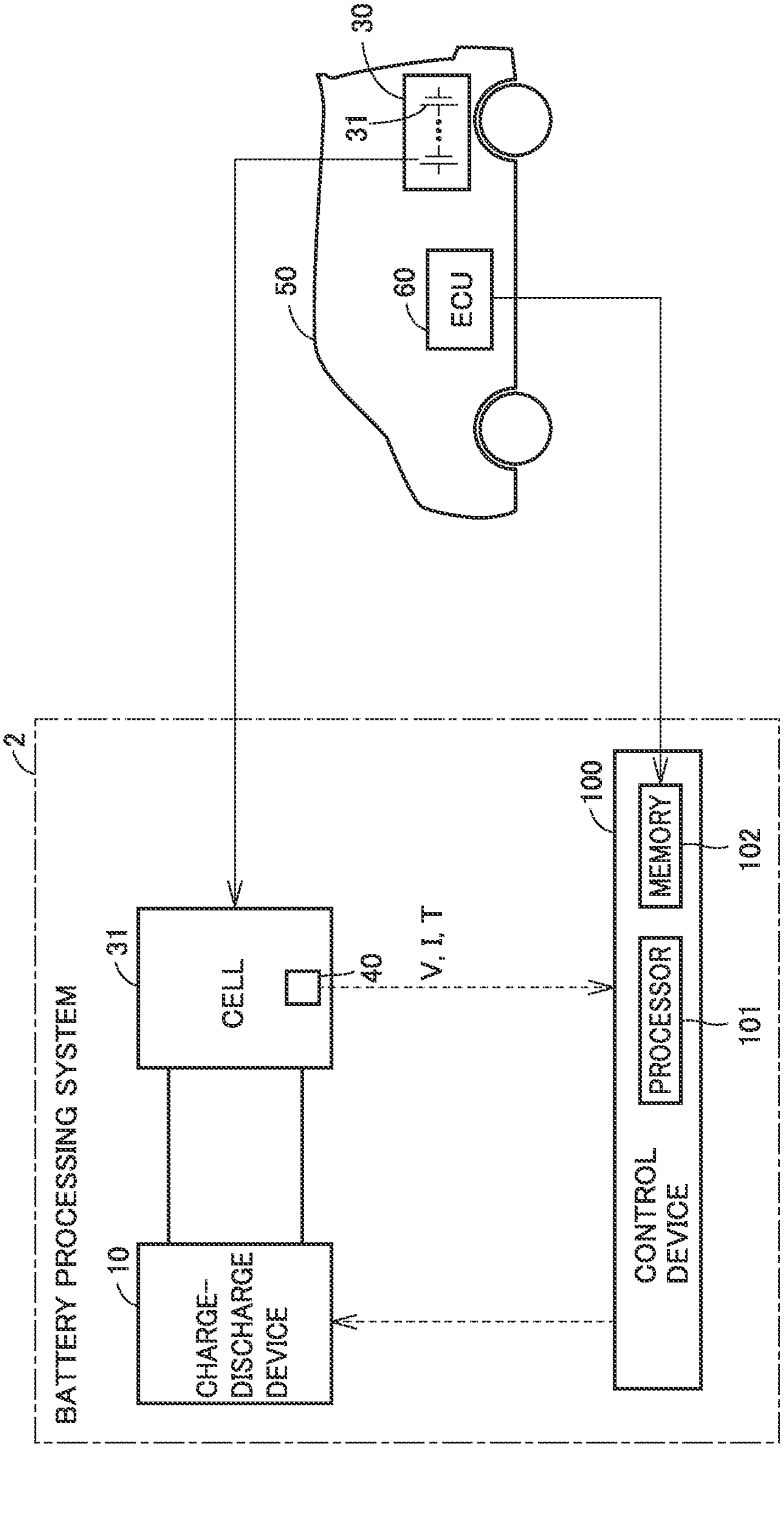
FIG. 1 shows an example of a configuration of a battery processing system according to a present embodiment.

FIG. 1 shows an example of a configuration of a battery processing system 2 according to the present embodiment. As shown in FIG. 1, battery processing system 2 includes a charge-discharge device 10, a cell 31, a detection unit 40, and a control device 100.

FIG. 1 shows a case, as an example, where a battery 30 is removed from a vehicle 50 and one of a plurality of cells 31 included in removed battery 30 is electrically connected to charge-discharge device 10. The plurality of cells 31 may be in a battery assembly state and in a state where each of various terminals can be connected to charge-discharge device 10, or may be released from the battery assembly state and in a state where each cell can be moved on a stand-alone basis.

Vehicle 50 may be a vehicle on which at least a lithium-ion battery is mounted, such as a battery electric vehicle or a hybrid electric vehicle, and is not limited particularly.

Charge-discharge device 10, for example, has a function of charging cell 31 by supplying charge electricity to cell 31, or causing cell 31 to discharge electricity stored therein. Charge-discharge device 10 charges cell 31 and discharges cell 31, according to a control signal from control device 100.

Cell 31 is a lithium-ion cell with a voltage of approximately 3 V to 4 V in a fully charged state.

Detection unit 40 includes a voltage sensor, a current sensor, and a temperature sensor (none of which are shown). The voltage sensor detects a voltage V of cell 31. The current sensor detects an electric current I inputted into and outputted from cell 31. The temperature sensor detects a temperature T of cell 31. Each sensor outputs a signal indicating a result of the respective detection to control device 100.

Control device 100 includes a processor 101 such as a CPU (Central Processing Unit), memory 102 such as a ROM (Read Only Memory) and a RAM (Random Access Memory), input-output ports (not shown) that receive as inputs or output various signals. Control device 100 controls charge-discharge device 10, based on an input signal from each sensor and on a map and a program stored in the memory. Control device 100 is configured to be communicable with vehicle 50 on which battery 30 has been mounted. When battery 30 is removed, an ECU (Electronic Control Unit) of vehicle 50 is communicably connected to control device 100, and predetermined information is transmitted from vehicle 50 to control device 100. Control device 100 stores the received predetermined information in memory 102 or an undepicted large-capacity storage device. In the present embodiment, an example of main control performed by control device 100 is elimination processing (first elimination processing and second elimination processing) for eliminating (which also can be expressed as recovering from or mitigating) high-rate degradation of cell 31. The elimination processing will be described in detail later.

Figure 2:
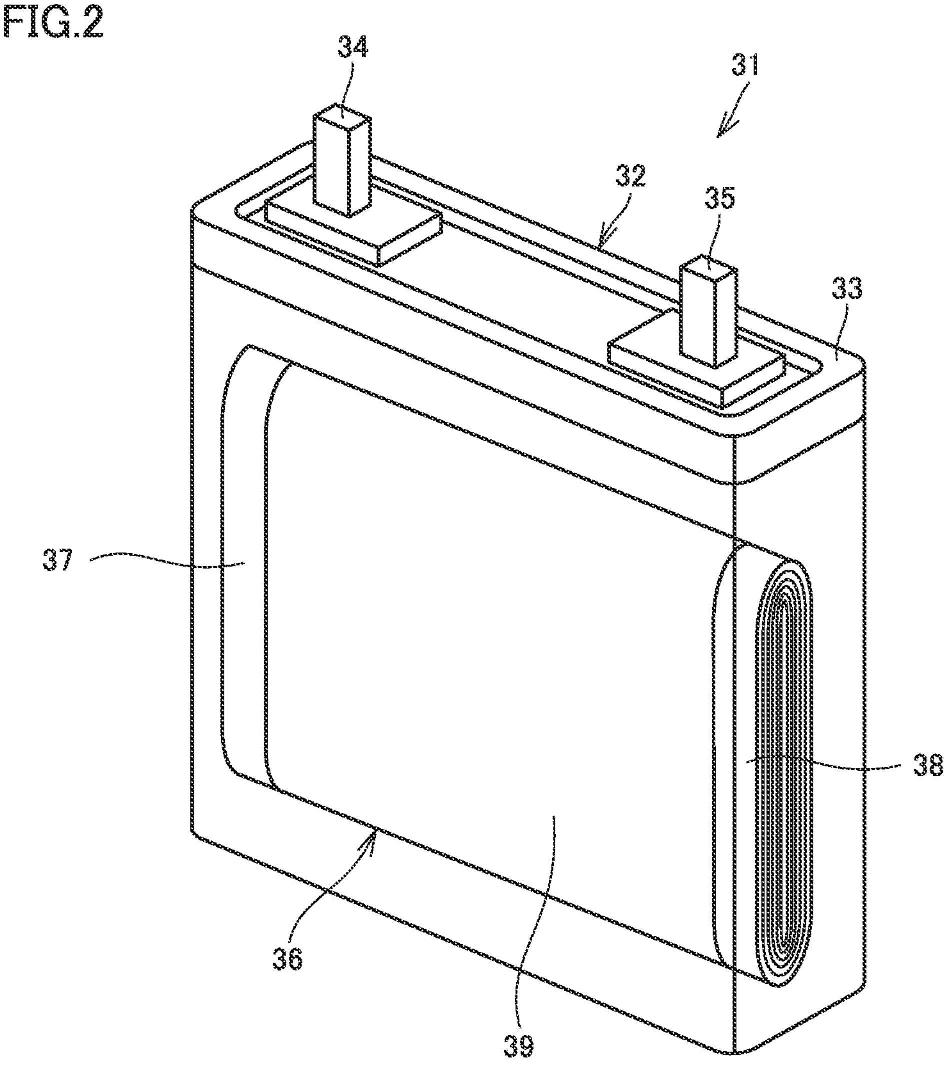
FIG. 2 is a diagram for describing, in more detail, an example of a configuration of a cell.

FIG. 2 is a diagram for describing, in more detail, an example of a configuration of cell 31. In FIG. 2, the inside of cell 31 is shown in a see-through manner.

Cell 31 has a cell case 32 in an approximately cuboid shape. An upper face of cell case 32 is closed with a lid body 33. One end of each of a positive-electrode terminal 34 and a negative-electrode terminal 35 protrudes out from lid body 33. The respective other ends of positive-electrode terminal 34 and negative-electrode terminal 35 are connected to an internal positive-electrode terminal and an internal negative-electrode terminal (neither of which are shown), respectively, within cell case 32.

An electrode assembly 36 is housed within cell case 32. Electrode assembly 36 is formed by a positive electrode 37 and a negative electrode 38 being layered with a separator 39 therebetween, and a resultant layered body being wound. An electrolyte solution (not shown) is contained in positive electrode 37, negative electrode 38, and separator 39. Note that for electrode assembly 36, the layered body can also be adopted instead of the wound body.

For positive electrode 37, negative electrode 38, separator 39, and the electrolyte solution, a conventionally known configuration and material can be used. At least one of active material of positive electrode 37 and active material of negative electrode 38 contains, for example, a material that is capable of intercalating and deintercalating lithium ions. Specifically, the active material of positive electrode 37 may contain a lithium composite oxide with a layered structure. Examples of the lithium composite oxide with a layered structure include a lithium cobalt composite oxide, a lithium nickel cobalt aluminum composite oxide, a lithium nickel cobalt manganese composite oxide, and the like. An example of the active material of negative electrode 38 is a carbon-based negative electrode active material, such as graphite.

As an example, for the separator, a polyolefin (for example, polyethylene or polypropylene) can be used. The electrolyte solution contains an organic solvent (for example, a mixed solvent of DMC (dimethyl carbonate), EMC (ethyl methyl carbonate), and EC (ethylene carbonate)), a lithium salt (for example, $LiPF_6$), an additive (for example, LiBOB (lithium bis(oxalate)borate) or $Li[PF_2(C_2O_4)_2]$), and the like.

In cell 31 configured as described above, various degradation can occur due to use by vehicle 50 when cell 31 is mounted on vehicle 50. In cell 31 that is a lithium-ion cell in particular, "high-rate degradation", which is a degradation phenomenon in which internal resistance of cell 31 increases, can occur when cell 31 continues to be charged and discharged with a relatively large amount of current (high-rate current). The high-rate degradation is degradation that occurs due to a nonuniformity of a concentration distribution of lithium ions (salt concentration distribution) within electrode assembly 36.

The high-rate degradation is a type of degradation that can be eliminated. In other words, when the internal resistance of cell 31 increases due to the high-rate degradation, the internal resistance of cell 31 can be lowered (restored) by executing elimination processing against the high-rate degradation.

In the present embodiment, it is quantitatively assessed to what extent the high-rate degradation, which is restorable degradation among various types of degradation, progresses. When the extent of progress of the high-rate degradation reaches a predetermined extent, the elimination processing for eliminating the high-rate degradation is executed. More specifically, control device 100 acquires a "degradation indicator value ΣD", which is an indicator value indicating an extent of progress of the high-rate degradation. For example, control device 100 may acquire information for calculating degradation indicator value ΣD from ECU 60 of vehicle 50 on which battery 30 has been mounted, and may calculate, by using the acquired information, degradation indicator value ΣD at a time when battery 30 is removed from vehicle 50. Alternatively, ECU 60 and control device 100 may perform operation as follows. Specifically, ECU 60 calculates degradation indicator value ΣD in each predetermined control period, and stores the calculated degradation indicator value ΣD in a memory of ECU 60. When battery 30 is removed from vehicle 50, control device 100 receives history of degradation indicator value ΣD by communicating with ECU 60, and stores the received history of degradation indicator value ΣD in memory 102. Control device 100 acquires degradation indicator value ΣD from memory 102. Note that the communication between control device 100 and ECU 60 may be wireless communication, or may be wired communication.

Hereinafter, assuming a case where degradation indicator value ΣD is calculated by ECU 60, a brief description is given of an example of a method of calculating degradation indicator value ΣD by using ECU 60.

ECU 60 calculates an indicator value D for calculating degradation indicator value ΣD, in each predetermined control period Δt. An indicator value of battery 30 calculated in an N-th (current) control period is denoted by D(N), and an indicator value calculated in an (N−1)-th (previous) control period is denoted by D(N−1). N is a natural number. Indicator value D(N) is calculated according to a following expression (1), which is a recurrence formula, with both an increase and a decrease in nonuniformity of the salt concentration distribution in connection with charge and discharge of battery 30 taken into consideration. Note that an initial value D(0) of the indicator value is set to, for example, zero.

$$D(N)=D(N-1)-D(-)+D(+) \quad (1)$$

In expression (1), a decrease amount D(−) in indicator value represents the amount of a decrease in nonuniformity of the salt concentration distribution due to lithium ions dispersing during a period between when the previous indicator value was calculated and when the current indicator value is calculated (during the control period Δt). Decrease amount D(−) can be calculated by using a forgetting coefficient α as in a following expression (2). Note that $0<\alpha>\Delta t<1$.

$$D(-)=\alpha\times\Delta t\times D(N-1) \quad (2)$$

Forgetting coefficient α is a coefficient corresponding to the rate of dispersion of lithium ions in the electrolyte solution, and depends on temperature T and SOC (State Of Charge) of battery 30. Accordingly, a correlation between forgetting coefficient α and temperature T and SOC is obtained beforehand through prior assessment (an experiment or a simulation), and stored as a map or a transformation formula in the memory of ECU 60. ECU 60 can calculate forgetting coefficient α from temperature T and SOC by referring to the map or the transformation formula. For each of an electric current coefficient β and a limit threshold value C, a map or a transformation formula can also be created from a result of prior assessment.

Referring back to expression (1), an increase amount D(+) in indicator value represents the amount of an increase in nonuniformity of the salt concentration distribution due to charge and discharge during the period between when the previous indicator value was calculated and when the current indicator value is calculated (during the control period Δt). Increase amount D(+) can be calculated by using electric current coefficient β, limit threshold value C, and electric current I as in a following expression (3).

$$D(+)=(\beta/C)\times I\times\Delta t \quad (3)$$

ECU 60 calculates degradation indicator value ΣD(N) by adding up indicator values D(N) with respect to all Ns, from the initial value (0) up to the current value (N), as shown in a following expression (4).

$$\Sigma D(N)=\gamma\times\Sigma D(N-1)+\eta\times D(N) \quad (4)$$

In expression (4), γ is an attenuation coefficient. Since the nonuniformity of salt concentrations is mitigated as a result of the dispersion of lithium ions over time, it is preferable to take into consideration the fact that previous indicator value ΣD(N−1) decreases when current indicator value ΣD(N) is calculated. Accordingly, attenuation coefficient γ, which is a coefficient of previous indicator value ΣD(N−1), is set to a smaller value than one. η is a correction coefficient and is set as appropriate. For attenuation coefficient γ and correction coefficient n, values that are predetermined and stored in memory 102 are used.

As described above, occurrence and mitigation of the nonuniformity of salt concentrations are represented by increase amount D(+) and decrease amount D(−) as described above, and current degradation indicator value ΣD(N) is calculated, whereby a change (an increase or a decrease) in high-rate degradation can be appropriately grasped.

In the present embodiment, for degradation indicator value ΣD(N), a value (first threshold value TH1) is predetermined that represents a situation where the nonuniformity of salt concentrations increases to a certain extent and it is preferable to prevent the high-rate degradation from further progressing. When degradation indicator value ΣD(N) exceeds first threshold value TH1, control device 100 executes the first elimination processing for eliminating the high-rate degradation of cell 31. By executing the first elimination processing, degradation due to the nonuniformity of salt concentrations is eliminated, and the charge capacity of cell 31 can be increased compared to before the first elimination processing is executed.

However, besides the degradation due to the nonuniformity of the concentration distribution of lithium ions, degradation due to a nonuniformity of potentials (hereinafter, also referred to as unevenness of potentials) in an electrode plane (hereinafter, referred to as "degradation due to the unevenness of potentials") can occur, as degradation of battery 30 occurring when charge and discharge are performed at a high rate. The unevenness of potentials occurs due to unevenness of resistance in the electrode plane caused by the nonuniformity of the concentration distribution or the like. Accordingly, even if the degradation due to the nonuniformity of salt concentrations can be eliminated from the lithium-ion battery through the first elimination processing, the degradation due to the nonuniformity of potentials can remain in some cases.

Figure 3:
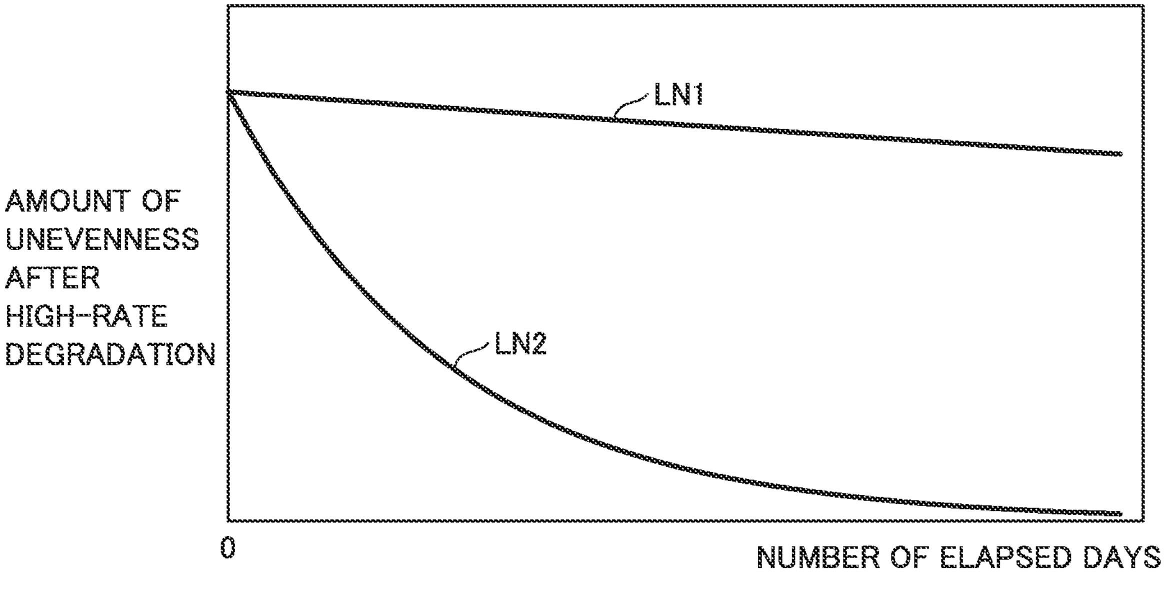
FIG. 3 shows an example of a relation between the amount of unevenness after high-rate degradation and the number of elapsed days.

FIG. 3 shows an example of a relation between the amount of unevenness after high-rate degradation and the number of elapsed days. A vertical axis of FIG. 3 represents the amount of unevenness after high-rate degradation. A horizontal axis of FIG. 3 represents the number of elapsed days. Note that the "amount of unevenness" corresponds to the amount of electricity (or the size of SOC) that cannot be charged due to the unevenness of potentials. LN1 in FIG. 3 indicates changes in amount of unevenness due to the nonuniformity of potentials when cell 31 is left alone after high-rate degradation occurs. LN2 in FIG. 3 indicates changes in amount of unevenness due to the nonuniformity of salt concentrations when cell 31 is left alone after high-rate degradation occurs. As indicated by LN2 in FIG. 3, the amount of unevenness due to the nonuniformity of salt concentrations decreases (degradation is gradually eliminated) as the number of lapsed days increases even if the first elimination processing is not executed. On the other hand, as indicated by LN1 in FIG. 3, although the amount of unevenness due to the unevenness of potentials decreases (degradation is gradually eliminated) as the number of lapsed days increases, the size of a rate of the decrease is smaller than the size of a rate of the decrease in amount of unevenness due to the nonuniformity of salt concentrations, and the degradation is in a state more difficult to be eliminated.

For the reasons described above, when battery 30 including cell 31 is relocated as a reused battery in another vehicle, or in any other like case, a larger degree of degradation than an actual degree may be recognized, or the life of battery 30 may be recognized erroneously to be shorter without a restorable capacity being realized, in some cases.

Accordingly, in the present embodiment, control device 100 acquires degradation indicator value ΣD(N) of cell 31 and, when acquired degradation indicator value ΣD(N) is a first threshold value TH1 or less and also when there is a period during which degradation indicator value ΣD(N) is more than a second threshold value TH2 that is smaller than first threshold value TH1, executes the second elimination processing for eliminating degradation due to the unevenness of potentials.

More specifically, control device 100 executes the second elimination processing when degradation indicator value ΣD(N) is first threshold value TH1 or less and also when there is a history in which degradation indicator value ΣD(N) changes from initial value (zero) to become more than second threshold value TH2. When degradation indicator value ΣD(N) exceeds first threshold value TH1, control device 100 executes the second elimination processing after executing the first elimination processing.

Thus, when there is a period during which degradation indicator value ΣD(N) is more than second threshold value TH2, since there is a possibility that degradation due to the unevenness of potentials occurs, the degradation due to the unevenness of potentials can be eliminated by executing the second elimination processing. In the present embodiment, it is assumed that second threshold value TH2 is, for example, the same value as the initial value of degradation indicator value ΣD (that is, zero).

Figure 4:
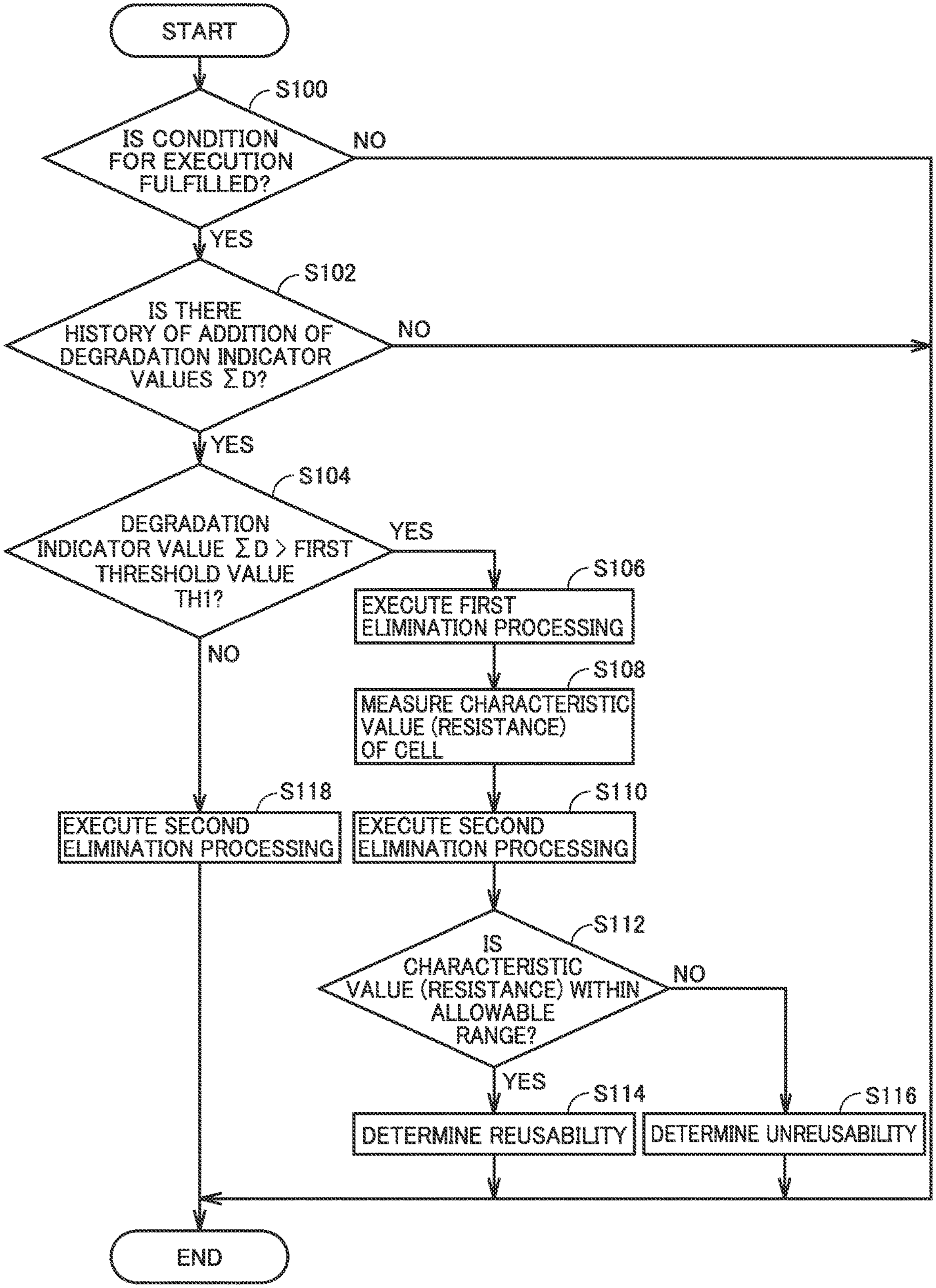
FIG. 4 is a flowchart showing an example of processing executed by a control device.

Referring to FIG. 4, an example of processing executed by control device 100 is described hereinafter. FIG. 4 is a flowchart showing an example of the processing executed by control device 100.

In step (hereinafter, step is abbreviated to S) 100, control device 100 determines whether or not a condition for execution of the elimination processing is fulfilled. The condition for execution includes, for example, a condition that a request to execute the elimination processing is received. For example, when charge-discharge device 10 and cell 31 are connected by an operator and operation for executing the elimination processing on control device 100 is received, control device 100 determines that a request to execute the elimination processing is received. When it is determined that the condition for execution is fulfilled (YES in S100), the processing is moved to S102.

In S102, control device 100 determines whether or not there is a history of addition of degradation indicator values ΣD. For example, when there is a history in which the value of degradation indicator value ΣD becomes a value other than the initial value, control device 100 determines that there is a history of addition of degradation indicator values ΣD. By using the history of degradation indicator value ΣD received from ECU 60, control device 100 determines whether or not there is a history of addition. When it is determined that there is a history of addition of degradation indicator values ΣD (YES in S102), the processing is moved to S104.

In S104, control device 100 determines whether or not degradation indicator value ΣD is larger than first threshold value TH1. When it is determined that degradation indicator value ΣD is larger than first threshold value TH1 (YES in S104), the processing is moved to S106.

In S106, control device 100 executes the first elimination processing. The first elimination processing includes, for example, processing of causing a change in volume of each of positive electrode 37 and negative electrode 38 of cell 31.

For example, control device 100 performs, as the first elimination processing, control of charge-discharge device 10 in such a manner that voltage V of cell 31 becomes within a predetermined voltage range including a peak voltage Vc, by increasing or decreasing voltage V around peak voltage Vc, or maintaining voltage V at around peak voltage Vc.

Peak voltage Vc is a voltage value indicating the position of a main peak of a dQ/dV-voltage characteristic line of cell 31. The dQ/dV-voltage characteristic line is a line representing a relation between dQ/dV, which is the ratio of a change amount dQ in amount Q of electricity stored in cell 31 to a change amount dV in voltage V of cell 31, and voltage V of cell 31. The dQ/dV-voltage characteristic line and peak voltage Vc are stored in memory 102 of control device 100. Control device 100 may receive the dQ/dV-voltage characteristic line and peak voltage Vc from ECU 60. Note that for the first elimination processing, a commonly known technique for eliminating degradation due to the nonuniformity of salt concentrations may be used, and the first elimination processing is not limited to the processing as described above. When the first elimination processing is executed, such a change in volume occurs that positive electrode 37 temporarily contracts. Since positive electrode 37 and negative electrode 38 are in contact with each other, with the contraction of positive electrode 37, such a change in volume occurs that negative electrode 38 expands. When negative electrode 38 expands, at least part of surplus electrolyte solution within cell case 32 flows into electrode assembly 36. Thus, the unevenness of concentrations in the electrolyte solution is mitigated, and degradation due to the nonuniformity of salt concentrations can be eliminated. Thereafter, the processing is moved to S108.

In S108, control device 100 measures a characteristic value (resistance) of cell 31. Control device 100 measures the resistance value of cell 31, for example, by using a result of detection obtained by using detection unit 40. For a method of measuring the resistance of cell 31, a commonly known technique may be used, and a detailed description thereof is not given. Thereafter, the processing is moved to S110.

In S110, control device 100 executes the second elimination processing. The second elimination processing includes processing of releasing the voltage of cell 31 to a predetermined voltage at which power of change to eliminate the unevenness of potentials increases. For example, control device 100 performs, as the second elimination processing, control of charge-discharge device 10 to have cell 31 over-discharged until the voltage of cell 31 reaches the predetermined voltage. For example, by controlling charge-discharge device 10 in such a manner that discharge is performed at a constant current, control device 100 has cell 31 over-discharged until the voltage of cell 31, which is detected by using detection unit 40, reaches the predetermined voltage (for example, approximately 1.5 V). The predetermined voltage is, for example, a voltage corresponding to a SOC that is lower than a range of use of SOC on a vehicle, which will be described later, and is set after tuned, through an experiment or the like, to the voltage at which no irreversible change occurs in cell 31. Thereafter, the processing is moved to S112.

In S112, control device 100 determines whether or not a characteristic value of cell 31 is within an allowable range. The characteristic value includes, for example, the resistance value of cell 31. The allowable range is a preset range and is tuned through an experiment or the like. When control device 100 determines that the characteristic value of cell 31 is within the allowable range (YES in S112), the processing is moved to S114.

In S114, control device 100 determines that reuse of cell 31 is possible. Thereafter, the processing is terminated. When it is determined that the characteristic value of cell 31 is out of the allowable range (NO in S112), the processing is moved to S116.

In S116, control device 100 determines that reuse of cell 31 is impossible. Thereafter, the processing is terminated. Note that when it is determined that degradation indicator value ΣD is first threshold value TH1 or less (NO in S104), the processing is moved to S118.

In S118, control device 100 executes the second elimination processing. The second elimination processing is similar to the second elimination processing described in the processing at S110. Accordingly, a detailed description thereof is not repeated. Thereafter, the processing is terminated. When it is determined that the condition for execution is not fulfilled (NO in S100), or when it is determined that there is no history of a change in degradation indicator value ΣD (NO in S102), then the processing is terminated.

Referring to FIGS. 5, 6, 7, and 8, operation of control device 100 based on the configuration and the flowchart as described above is described.

For example, when battery 30 is removed from vehicle 50 and one of the plurality of cells 31 included in battery 30 is electrically connected to charge-discharge device 10, and when control device 100 is requested to execute the elimination processing, it is determined that the condition for execution is fulfilled (YES in S100). In such a case, it is determined whether or not there is a history of addition of degradation indicator values ΣD (S102). When it is determined, from the history of degradation indicator value ΣD received from ECU 60, that there is a history of addition of degradation indicator values ΣD (YES in S102), control device 100 determines whether or not degradation indicator value ΣD is larger than first threshold value TH1.

When it is determined that degradation indicator value ΣD is first threshold value TH1 or less (NO in S104), the second elimination processing is executed (S118). When the second elimination processing is executed, discharge control at a constant current is performed through control by charge-discharge device 10 until the voltage of cell 31 reaches the predetermined voltage (approximately 1.5 V).

When discharge to approximately 1.5 V (hereinafter, also referred to as deep discharge) is performed, the relation between the SOC of cell 31 and the potential of negative electrode 38 (hereinafter, referred to as negative electrode potential) becomes a relation in which the negative electrode potential greatly varies with changes in SOC.

Figure 5:
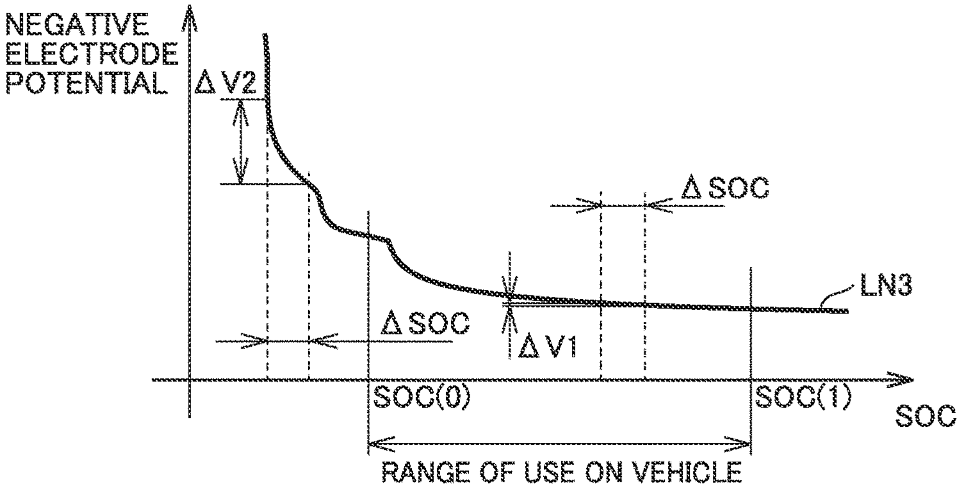
FIG. 5 shows an example of a relation between SOC and negative electrode potential.

FIG. 5 shows an example of the relation between the SOC and the negative electrode potential. A vertical axis of FIG. 5 represents the negative electrode potential. A horizontal axis of FIG. 5 represents the SOC. LN3 in FIG. 5 indicates changes in negative electrode potential with respect to changes in SOC.

As indicated by LN3 in FIG. 5, the relation between the SOC and the negative electrode potential in the lithium-ion battery has a relation in which the negative electrode potential increases as the SOC becomes lower. Particularly in the range of use in a state where cell 31 is mounted as battery 30 on vehicle 50, for example, a change amount ΔV1 in negative electrode potential against a change amount ΔSOC in SOC of cell 31 is smaller than a change amount ΔV2 in negative electrode potential against a change amount ΔSOC in SOC in a range that is lower than the range of use. Such a change amount in negative electrode potential against a change in SOC affects the power of change to eliminate the unevenness of potentials that occurs in the electrode plane.

Figure 6:
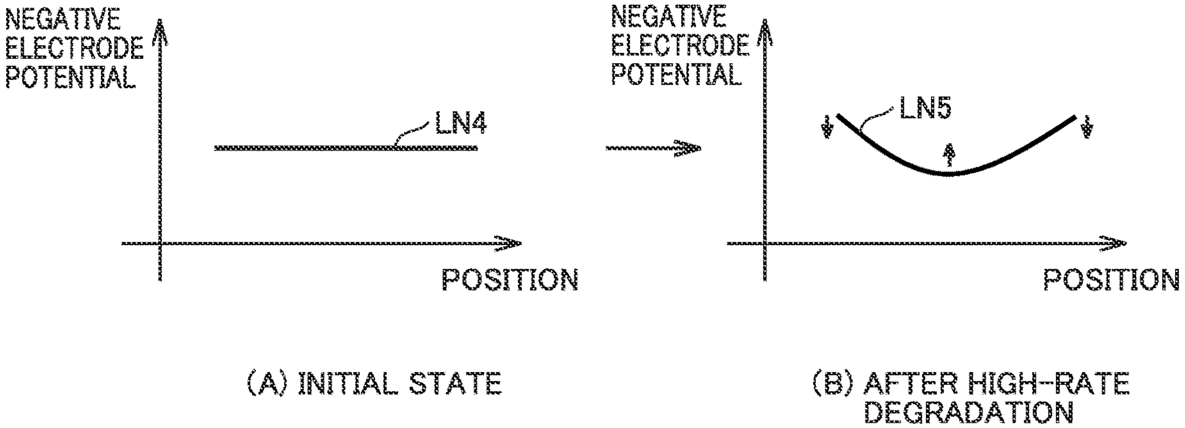
FIG. 6 shows an example of changes in negative electrode potential distribution against positions in an electrode plane.

FIG. 6 shows an example of changes in negative electrode potential distribution against positions in the electrode plane. FIG. 6(A) shows an example of a negative electrode potential distribution (LN4) against positions in the electrode plane in an initial state. FIG. 6(B) shows an example of a negative electrode potential distribution (LN5) against positions in the electrode plane after high-rate degradation.

As indicated by LN4 in FIG. 6, in the initial state, the negative electrode potential of cell 31 has a constant value, regardless of a position in the electrode plane. After high-rate degradation, the unevenness of potentials occurs, and the negative electrode potential of cell 31 becomes as indicated by LN5 in FIG. 6, with negative electrode potentials around the center of the electrode plane falling below the negative electrode potential in the initial state, and negative electrode potentials around end portions increasing over the negative electrode potential in the initial state. At the time, as indicated by arrows in FIG. 6(B), around the center of the electrode plane, the power of change occurs in a direction in which the negative electrode potential increases, and around the end portions of the electrode plane, the power of change occurs in a direction in which the negative electrode potential decreases. However, since such power of change is smaller than the power of change occurring after the second elimination processing is executed, which will be describe later, it requires a longer time to eliminate the unevenness of potentials, as described by using FIG. 3.

Figure 7:
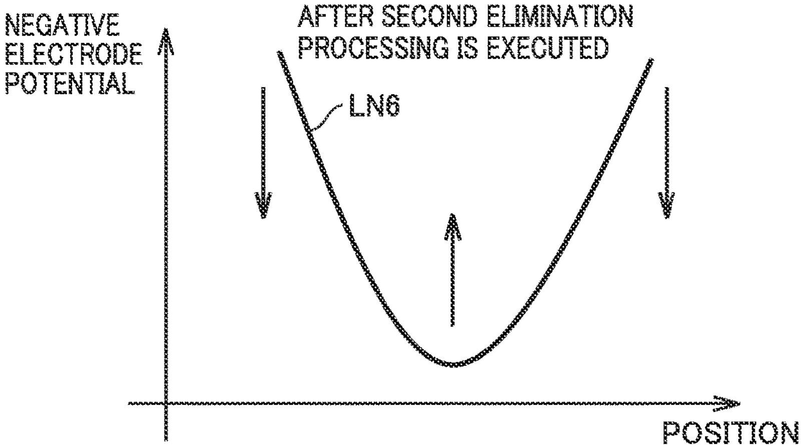
FIG. 7 shows an example of a negative electrode potential distribution against positions in the electrode plane after second elimination processing is executed.

FIG. 7 shows an example of a negative electrode potential distribution against positions in the electrode plane after the second elimination processing is executed. LN6 in FIG. 7 indicates changes in negative electrode potential against changes in position in the electrode plane after the second elimination processing is executed.

As indicated by LN6 in FIG. 7, after the second elimination processing is executed, negative electrode potentials around the center of the electrode plane decrease greatly compared to LN5 in FIG. 6 described above, and negative electrode potentials around the end portions of the electrode plane increase greatly compared to LN5 in FIG. 6 described above. At the time, as indicated by arrows in FIG. 7, around the center of the electrode plane, the power of change in the direction in which the negative electrode potential increases acts significantly compared to LN5 in FIG. 6 described above, and around the end portions of the electrode plane, the power of change in the direction in which the negative electrode potential decreases acts significantly compared to LN5 in FIG. 6 described above. The power of change caused by executing the second elimination processing acts until the unevenness of potentials is eliminated, whereby the unevenness of potentials is eliminated in a shorter time than before the second elimination processing is executed.

Figure 8:
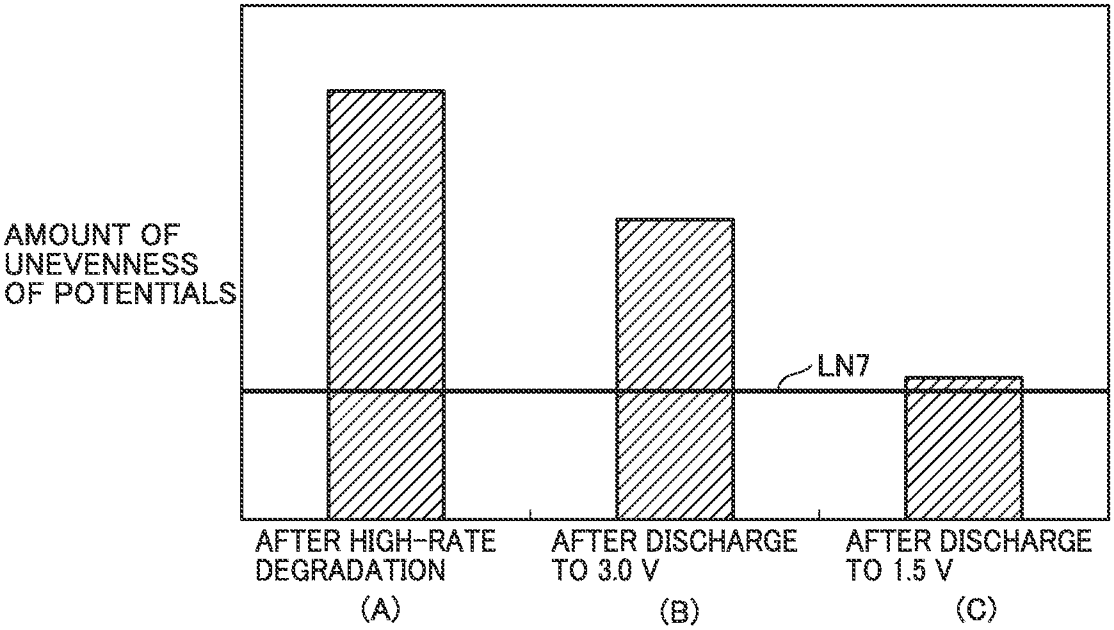
FIG. 8 shows an example of changes in amount of unevenness due to unevenness of potentials between before and after various types of discharge are performed.

FIG. 8 shows an example of changes in amount of unevenness due to the unevenness of potentials, between before and after various types of discharge are performed. Note that the "amount of unevenness" corresponds to the amount of electricity (or the size of SOC) that cannot be charged due to the unevenness of potentials, as described above. In the following description, the "amount of unevenness" is also referred to as "amount of unevenness of potentials". FIG. 8(A) shows an example of the amount of unevenness of potentials after high-rate degradation occurs and before the second elimination processing is executed. FIG. 8(B) shows an example of the amount of unevenness of potentials after discharge control to 3.0 V is performed. Further, FIG. 8(C) shows an example of the amount of unevenness of potentials after the second elimination processing is executed (that is, discharge control to 1.5 V is performed). LN7 in FIG. 8 indicates an example of the amount of unevenness of potentials in the initial state of cell 31.

As shown in FIG. 8(C), after the second elimination processing is executed, the amount of unevenness of potentials becomes in a decreased state, compared to the amount of unevenness of potentials before discharge control is performed, shown in FIG. 8(A). The decreased amount of unevenness of potentials in such a case has a value that is smaller than a decreased amount of unevenness of potentials after the discharge control to 3.0 V is performed, shown in FIG. 8(B), and that is a result of decreasing to the approximately same amount of unevenness of potentials as the amount of unevenness of potentials in the initial state that is indicated by LN7 in FIG. 8. As described above, by executing the second elimination processing, degradation due to the unevenness of potentials can be eliminated to an extent equivalent to the amount of unevenness of potentials in the initial state.

When it is determined that degradation indicator value ΣD is more than first threshold value TH1 (YES in S104), the first elimination processing is executed (S106). By executing the first elimination processing, for example, discharge is performed at a voltage around peak voltage Vc in the above-described dQ/dV-voltage characteristic line, whereby a change in volume is caused in each of the positive electrode and the negative electrode, the electrolyte solution is thereby caused to flow therein, and degradation due to the unevenness of salt concentrations is thus eliminated. Thereafter, the resistance value of cell 31 is measured (S108), the second elimination processing is executed (S110), and degradation due to the unevenness of potentials is eliminated. After the second elimination processing is executed, when the resistance value of cell 31 is within the allowable range, it is determined that reuse of cell 31 is possible (S114). Note that when the resistance value of cell 31 is out of the allowable range, it is determined that reuse of cell 31 is impossible (S116).

The processing as described above is executed, for example, for all cells 31 included in battery 30, whereby discrimination can be made between reusable cells and unreusable cells in battery 30.

As described above, according to the battery processing system 2 in the present embodiment, when there is a history in which degradation indicator value ΣD changes from the initial value, the second elimination processing is executed because there is a possibility that degradation due to the nonuniformity of potentials in the electrode plane of the electrode assembly 36 occurs, and the degradation thus can be eliminated. Moreover, when degradation indicator value ΣD is larger than first threshold value TH1, the first elimination processing is executed, and degradation due to the nonuniformity of the concentration distribution of lithium ions therefore can be eliminated. Accordingly, the battery processing system and the battery processing method that eliminate degradation due to the unevenness of potentials can be provided.

Further, since the second elimination processing includes the processing of performing over-discharge to cause cell 31 to reach the predetermined voltage, a change can be caused that eliminates early on the nonuniformity of potentials in the electrode plane of electrode assembly 36.

Furthermore, when degradation indicator value ΣD is more than first threshold value TH1, the second elimination processing is executed after the first elimination processing is executed. Accordingly, by executing the second elimination processing, degradation due to the nonuniformity of potentials in the electrode plane of electrode assembly 36 can be eliminated, and by executing the first elimination processing, degradation due to the nonuniformity of the concentration distribution can be eliminated.

Moreover, since at least one of the active material of the positive electrode and the active material of the negative electrode contains a material that is capable of intercalating and deintercalating lithium ions, degradation due to the nonuniformity of potentials in the electrode plane of electrode assembly 36 can be eliminated by executing the second elimination processing.

Hereinafter, modifications are described.

Although it is described in the embodiment that control device 100 acquires degradation indicator value ΣD of cell 31 included in battery 30 from ECU 60 and the first elimination processing or the second elimination processing is executed based on the acquired degradation indicator value ΣD by using charge-discharge device 10, the first elimination processing or the second elimination processing may be executed by, in place of control device 100, ECU 60 using an electric power converter (not shown) mounted in vehicle 50, based on degradation indicator value ΣD. In such a case, vehicle 50 may include a circuit that allows any of the plurality of cells 31 included in battery 30 to be individually charged or discharged, or to be disconnected from a target to be charged or discharged.

Moreover, although it is described in the embodiment that at least the second elimination processing is executed when there is a history of addition of degradation indicator values ΣD, the second elimination processing may be executed when there is a period during which degradation indicator value ΣD is more than second threshold value TH2, and at least the second elimination processing may be executed when degradation indicator value ΣD is in a state of being more than second threshold value TH2.

Further, although it is described in the embodiment that second threshold value TH2 is zero, second threshold value TH2 is not limited to zero.

All or some of the above-described modifications may be combined as appropriate and implemented.

Although an embodiment of the present disclosure has been described and illustrated, it is clearly understood that the same is by way of illustration and example only and is not to be taken by way of limitation. The scope of the present disclosure is interpreted by the terms of the appended claims, and is intended to incorporate meanings equivalent to the appended claims and all changes made within the scope.

What is claimed is:

1. A battery processing system comprising:

a lithium-ion battery including an electrode assembly; and a control device that controls charge and discharge of the lithium-ion battery, wherein the control device acquires an indicator value indicating an extent of progress of degradation of the lithium-ion battery due to a nonuniformity of a concentration distribution of lithium ions within the electrode assembly, when the indicator value is more than a first threshold value, executes first elimination processing of eliminating the degradation due to the nonuniformity of the concentration distribution, and when the indicator value is the first threshold value or less and also when there is a period during which the indicator value is more than a second threshold value that is smaller than the first threshold value, executes second elimination processing of eliminating degradation due to a nonuniformity of potentials in an electrode plane of the electrode assembly that occurs as a result of discharge of the lithium-ion battery.

2. The battery processing system according to claim 1, wherein the second elimination processing includes processing of performing over-discharge of the lithium-ion battery to cause the lithium-ion battery to reach a predetermined voltage.

3. The battery processing system according to claim 1, wherein the control device executes the second elimination processing when the indicator value is the first threshold value or less and also when there is a history in which the indicator value changes from an initial value to become more than the second threshold value.

4. The battery processing system according to claim 1, wherein the control device executes the second elimination processing after executing the first elimination processing when the indicator value is more than the first threshold value.

5. The battery processing system according to claim 1, wherein the electrode assembly includes a positive electrode and a negative electrode, and at least one of active material of the positive electrode and active material of the negative electrode contains a material that is capable of intercalating and deintercalating the lithium ions.

6. A battery processing method for eliminating degradation of a lithium-ion battery including an electrode assembly, the battery processing method comprising:

acquiring an indicator value indicating an extent of progress of degradation of the lithium-ion battery due to a nonuniformity of a concentration distribution of lithium ions within the electrode assembly;

when the indicator value is more than a first threshold value, executing first elimination processing of eliminating the degradation due to the nonuniformity of the concentration distribution; and when the indicator value is the first threshold value or less and also when there is a period during which the indicator value is more than a second threshold value that is smaller than the first threshold value, executing second elimination processing of eliminating degradation due to a nonuniformity of potentials in an electrode plane of the electrode assembly that occurs as a result of discharge of the lithium-ion battery.

* * * * *